US006174416B1

(12) United States Patent
Magenau et al.

(10) Patent No.: US 6,174,416 B1
(45) Date of Patent: Jan. 16, 2001

(54) MICROMECHANICAL COMPONENT PRODUCTION METHOD

(75) Inventors: Horst Magenau, Gerlingen; Frank Schatz, Kornwestheim; Armin Glock, Plüderhausen; Elke Krauss, Ditzingen; Thomas Schittny, Steinheim; Alexandra Jauernig, Leonberg; Ronald Glas, Braunschweig, all of (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/269,949

(22) PCT Filed: Sep. 29, 1997

(86) PCT No.: PCT/DE97/02230

§ 371 Date: Oct. 19, 1999

§ 102(e) Date: Oct. 19, 1999

(87) PCT Pub. No.: WO98/15676

PCT Pub. Date: Apr. 16, 1998

(30) Foreign Application Priority Data

Oct. 9, 1996 (DE) .............................................. 196 41 531

(51) Int. Cl.[7] ...................................................... C23C 14/34

(52) U.S. Cl. ............................... 204/192.15; 204/192.12; 205/118; 205/135; 216/41; 438/703

(58) Field of Search ......................... 204/192.12, 192.15; 205/118, 135; 216/41; 438/703

(56) References Cited

U.S. PATENT DOCUMENTS

| | | | |
|---|---|---|---|
| 5,080,763 | 1/1992 | Baigetsu | 205/95 |
| 5,194,402 | 3/1993 | Ehrfeld et al. | 437/180 |
| 5,387,495 | 2/1995 | Lee et al. | 430/315 |
| 5,755,947 * | 5/1998 | McElhanon et al. | 205/118 |
| 6,030,851 * | 2/2000 | Grandmont et al. | 438/53 |

FOREIGN PATENT DOCUMENTS

| | | | |
|---|---|---|---|
| 39 19 876 | 12/1990 | (DE) | F16K/31/126 |
| 0 206 133 | 12/1986 | (EP) | H01B/1/12 |

OTHER PUBLICATIONS

Minami et al., "Fabrication of Distributed Electronic Micro Actuator (DEMA)", Journal of Microelectromechanical Systems, Bd. 2, Nr. 3, pp. 121–127.*

* cited by examiner

*Primary Examiner*—Nam Nguyen
*Assistant Examiner*—Steven H. Ver Steeg
(74) *Attorney, Agent, or Firm*—Kenyon & Kenyon

(57) ABSTRACT

Micromechanical component and a method for its production having vertically arranged layers made of metallic materials, with the layers adhering firmly to one another at least in part. The layers of the micromechanical component are attached to each other via intermediate layers, with the intermediate layers being at least one sputtered layer which can be applied in the form of a metallic start plating to the underlying layer, which includes metallic and nonmetallic areas, and to which an upper metallic electroplated layer can be applied. Upon their completion, the layers yield the micromechanical component with layers that adhere to one another or layers which can be partially detached from one another.

7 Claims, 4 Drawing Sheets

MICROMECHANICAL COMPONENT PRODUCTION METHOD

BACKGROUND INFORMATION

1. Field of the Invention

The present invention relates to a micromechanical component, which is composed of multiple layers, for example electrically conductive and non-conductive layers or areas, or layers or areas made of metallic and non-metallic materials, and a method for its production.

2. Background Information

In a component used as a microvalve and described in German Patent Application No. 39 19 876, individual layers are processed by micromechanical production methods in the construction of the microvalve. For example, the surface of a silicon wafer is patterned by photolithography and predetermined areas partially removed in a subsequent etching step, thus forming the mechanical elements by processing these layers in a three-dimensional pattern.

Conventional production methods include UV gravure lithography for patterning the non-conductive areas and multilayer electroplating for producing metallic, conductive areas. In this case, a conductive start layer for later electrodeposition with the application of external current in the proper areas is also needed on non-conductive carrier layers.

Conductive metal layers applied as carrier layers to the entire surface of non-conductive substrates are known as metallic start platings. These start layers can be applied by resist-coating (spraying, dipping, spinning, etc.) or with the aid of various wet-chemical methods or PVD (physical vapor deposition) methods (vaporization, sputtering, etc.). They either have an intrinsic electrical conductivity that is sufficient for electroplating with the application of external current or are used as the nucleation layer for deposition of a metal layer without the application of external current, which, in turn, serves as the start layer for subsequent multilayer electroplating with the application of external current.

Wet-chemical methods (DMS-E methods) for patterning surfaces are also known from p.c. board technology discribed in European Patent Application No. 0 206 133), for example, in order to make the holes drilled into the p.c. board conductive. In this case, a start layer is patterned or applied selectively to the non-conductive areas of the p.c. board surface, thus making the entire surface electrically conductive. However, these processing methods are incompatible with the processes of UV gravure lithography and multilayer electroplating because they lack the necessary precision.

Methods which allow two metal layers on an intermediate layer to be separated are also known. To do this, the intermediate layer is selectively removed from the remaining materials in the form of a sacrificial layer by etching or stripping. This method leaves gaps measuring several $\mu$m thick between the layers to be separated, which is disadvantageous especially when tight-fitting surfaces need to be produced which will also be used as sealing surfaces.

SUMMARY OF THE INVENTION

In one embodiment, a method for producing a micromechanical component according to the present invention has the advantage that, in carrying out the multilayer electroplating step, metallic start platings are applied which are compatible with the other processes and materials used in UV gravure lithography and multilayer electroplating. The metallic start plating according to the present invention makes it possible to deposit the new electroplated layer so that it adheres well to the layer beneath it, thus providing three-dimensionally patterned components in a layered structure.

The method according to the present invention for producing the micromechanical components has a particular advantage over previously known processes, especially with regard to the metallic start plating of a substrate that has electrically conductive and non-conductive areas, for the following reasons:

1: It is possible to use sputtering processes at substrate temperatures below 100° C., or wet-chemical processes in a pH range below pH 8.5 (very slightly alkaline or acidic values) which are compatible with the materials and production processes used in UW gravure lithography. The resists in the non-conductive areas thus continue to adhere to the substrate during the production steps and can be removed as needed at the end of the process chain using the Conventional.

2: The metallic surfaces of the conductive areas are chemically passivated by the individual process steps only to the extent that, prior to the application of each new plating, they can be reactivated as needed using standard methods, so that they can accept additional metal layers. This is the only way to ensure that the metallic electroplated layers deposited upon one another will adhere firmly to each other.

3. The sputtered layer is patterned by etching the lower electroplated layer. This ensures that the nucleation or start layer covers the non-conductive areas very precisely, leaving the metallic areas of the substrate unchanged. The adhesion between the electroplated layers can therefore be as strong as the adhesion between two unpatterned electroplated layers deposited upon one another.

According to another embodiment, the metallic start plating is designed so that one poorly adhering layer is provided in the form of a start layer in certain areas of the substrate. In these areas, the upper electroplated layer can be lifted away from the lower one, and moveable components can be created with as narrow a clearance as desired between their contact surfaces. Examples include sealing elements for fluid applications and normally closed switching elements.

The production method according to the present invention makes it possible to further develop the manufacturing methods using UV gravure lithography and multilayer electroplating in order to produce components with three-dimensional patterns and recesses. This is achieved with the use of the electrically conductive intermediate layers, which allow metals to be deposited electrolytically, i.e., with the application of external current, to surfaces that have metallic patterns and electrically insulating plastic. The metallic areas in the surface of the layers are generally composed of a lower electroplated layer, and the insulating areas are composed of a photopatterned resist (such as polyimide, AZ resist (photoresist) or solid resists).

Applications of the component according to the present invention are three-dimensional microcomponents made of metal with recesses, such as turbulent flow nozzles for fuel-air mixing in spark-ignition engines as well as microsensors or components which have additional movable structures such as microvalves, microrelays, microswitches, or micromotors.

DETAILED DESCRIPTION

Figure 1:
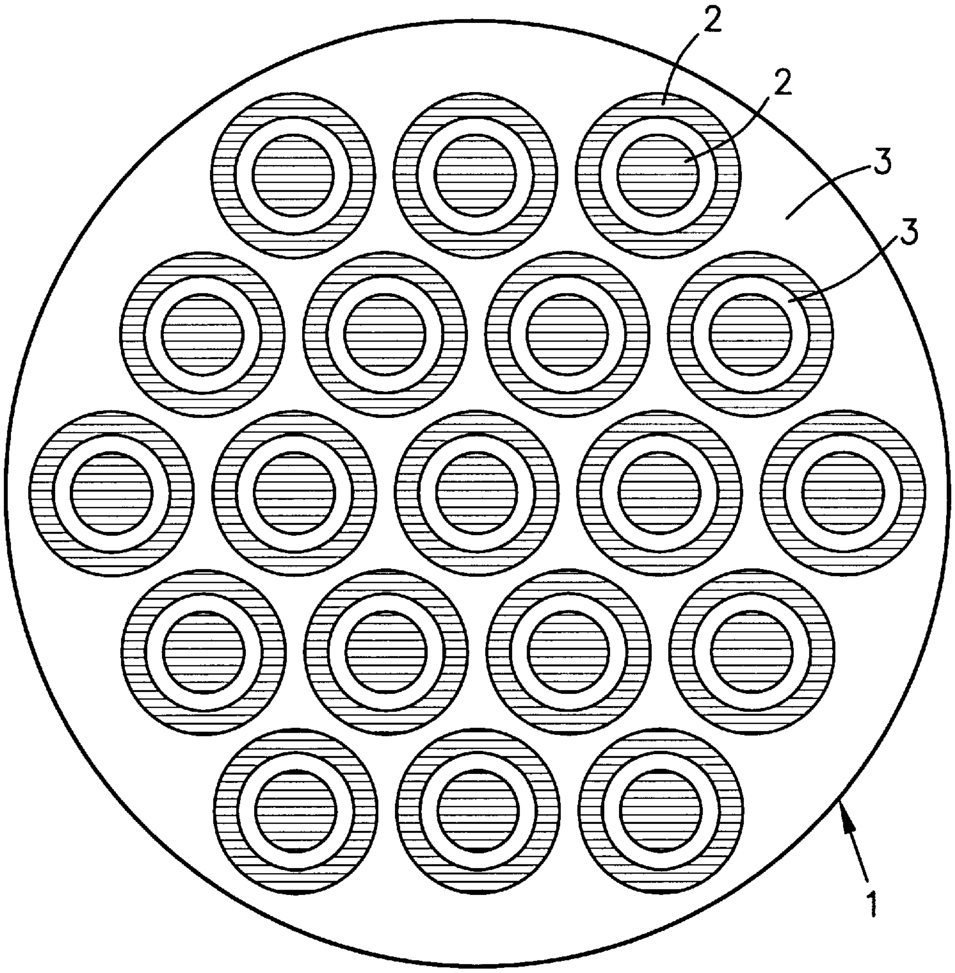
FIG. 1 shows a top view of a substrate as a carrier layer, having a first layer with conductive and non-conductive areas.

FIG. 1 shows the basis for producing a micromechanical component, e.g., a substrate 1 as the carrier layer for additional layers to be applied. The substrate can be metal, silicon, ceramic, or glass; in the embodiment described below, it is made of glass. The usual thicknesses of this substrate range from 500 $\mu$m to 2 mm, and metallic start layers with good adhesion characteristics must be applied in order to use, in particular, electroplating processes with the application of external current.

Figure 2:
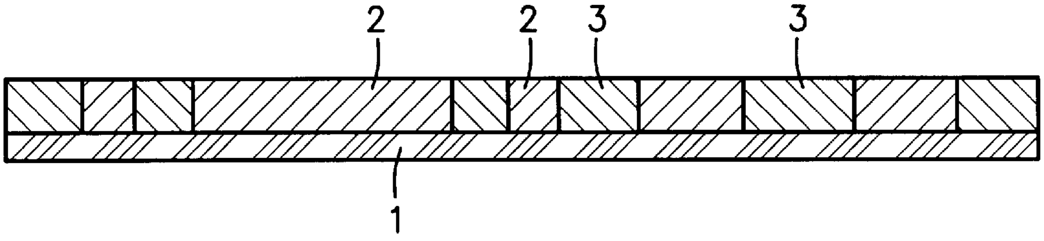
FIG. 2 shows a cross-section of partial regions of the substrate illustrated in FIG. 1.

In the beginning, substrate 1 is provided in a Conventional manner with conductive areas 2 and non-conductive areas 3. For this purpose, the substrate is coated with a resist (such as a polyimide, AZ resist or solid resist) by spin-coating, spraying or lamination. The resist is exposed and developed with the desired pattern. Metal is then electrodeposited in the open regions in the resist. Conductive areas 2 in the lower electroplated layer are made of a metallic material (such as copper or nickel) and non-conductive areas 3 are made of the resist. FIG. 2 shows a cross-section of areas 2 and 3. The subsequent production steps are explained on the basis of the sectional representations shown in FIGS. 3*a*–3*f* In a first production step FIG. 3*a* a layer 4 made of silver, palladium or platinum is sputtered onto the entire surface of substrate 1, including areas 2 and 3; in the embodiment described below this layer is made of palladium.

The sputtering process is essentially known: the target is bombarded with high-energy ions from an ionized gas (such as argon). This ion bombardment causes atoms and/or molecules to be ejected from the target and accelerated onto substrate 1 at 1/100 the kinetic energy of the ions. This produces a thin, highly uniform new surface layer on substrate 1. Layer 4 is just a few nanometers thick if this sputtered layer 4 is to act as a nucleation layer for a subsequent metallic start layer to be applied without the application of external current (i.e., by deposition), and 5 nm to 100 nm thick if sputtered layer 4 itself is to serve as the start layer for subsequent electroplating processes with the application of external current.

Figure 3A:
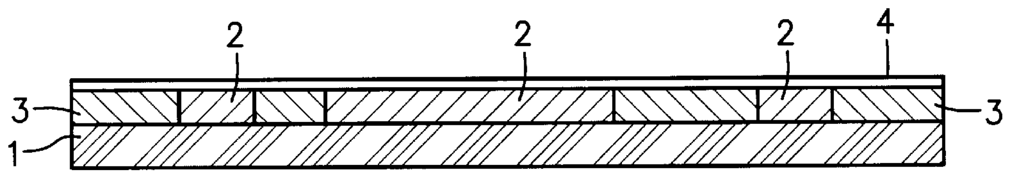
FIG. 3*a* shows cross-sections of multiple layers on the substrate during a first step according to the first embodiment of the present invention.
Figure 3B:
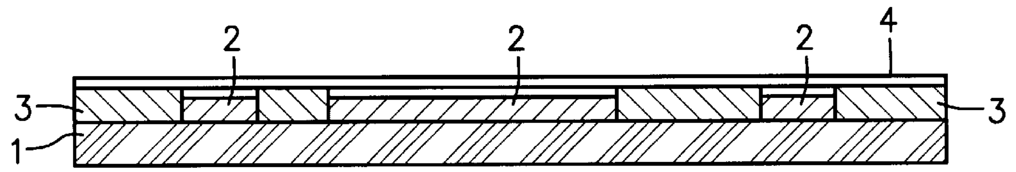
FIG. 3*b* shows cross-sections of the multiple layers on the substrate during a second step according to the first embodiment.
Figure 3C:
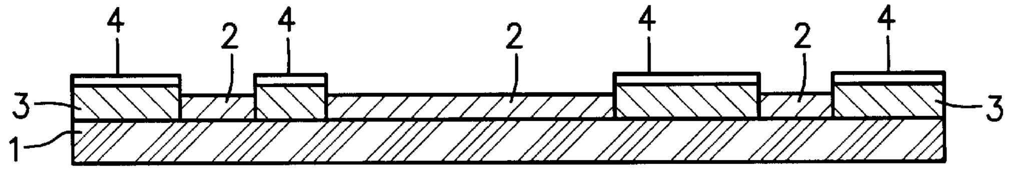
FIG. 3*c* shows cross-sections of the multiple layers on the substrate during a third step according to the first embodiment.

In a second production step, as shown in FIG. 3*b*, the lower metal layer is etched all the way through relatively porous sputtered layer 4 in conductive areas 2. This step is advantageously carried out with a standard process (electrolytic activation) that is essentially known in multilayer electroplating, in which the previously produced arrangement is treated with a non-passivating electrolyte (such as an Ni strike bath containing Cl ions), with conductive areas 2 subsequently being eroded anodically several micrometers beneath sputtered layer 4.

Sputtered layer 4 is not eroded in this production step, but loses its adhesion to the lower metal layer in areas 2 and can be stripped and removed from this metal layer in a flushing step. Non-conductive areas 3 are thus coated entirely without requiring photolithographic patterning with new lateral tolerances shown in FIG. 3*c*.

Figure 3D:
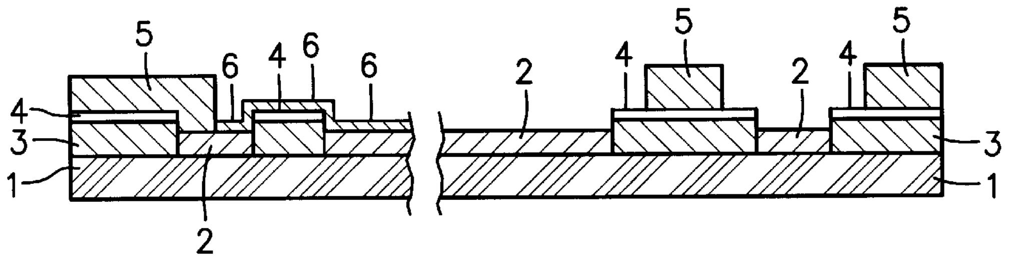
FIG. 3*d* shows cross-sections of the multiple layers on the substrate during a fourth step according to the first embodiment.

To apply a further patterned layer, another photopatternable resist is applied, exposed, and developed, so that non-conductive areas 5 of the resist are retained shown in FIG. 3*d*.

In the next production step, also shown in FIG. 3*d*, the exposed areas of sputtered layer 4 and the exposed areas 3 of lower electroplated layer are chemically reinforced or plated with a metal (such as nickel) without the application of external current, i.e., in a redox reaction (visible only in the left-hand portion of FIG. 3*d*). But first, areas 2 of the lower electroplated layer is reactivated by anodic erosion and sputtered layer 4 also activated in a reducing bath (e.g., with sodium borohydride). Metal can now be deposited without the application of external current onto the surfaces that have been activated in this manner, thereby reinforcing sputtered layer 4. The fact that chemical deposition is also carried out on the lower electroplated layer at the same time is not problematic in this case if a very similar material is used for both the electroplated layer and the chemically deposited layer.

Figure 3E:
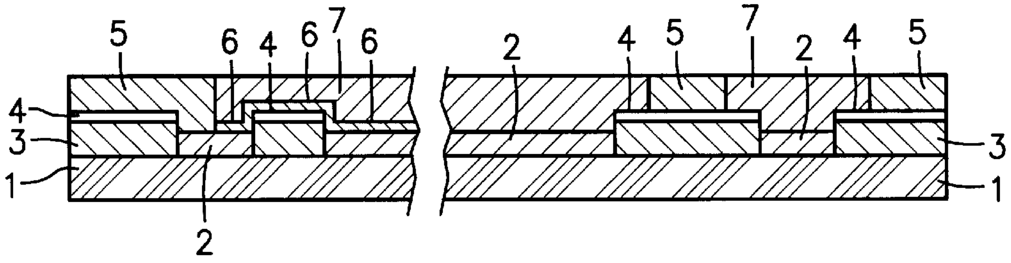
FIG. 3*e* shows cross-sections of the multiple layers on the substrate during a fifth step according to the first embodiment.

With a method commonly used in multilayer electroplating, an upper metallic electroplated layer 7 can be applied with the application of external current to chemically deposited layer 6, resulting in the arrangement shown in FIG. 3*e*.

Figure 3F:
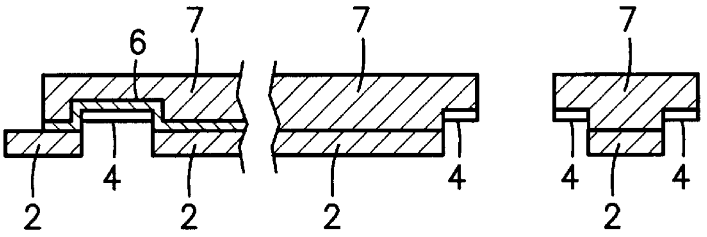
FIG. 3*f* shows cross-sections of the multiple layers on the substrate during a sixth step according to the first embodiment.

Metallic electroplated layers 2 and 7 now adhere to each other via chemically deposited layer 6 and, after lifting them away from substrate 1 and removing resist layers 3 and 5, they can form a micromechanical component with complex patterns, including recesses, as shown in FIG. 3*f*.

Alternatively, electrodeposited layer 7 can be deposited directly (shown at the right side of FIG. 3*d*, and FIG. 3*e*) following the activation step in the case of the thicker variant of sputtered layer 4 (5 nm to 100 nm).

When using the production method described on the basis of the embodiment, note that the sub-processes described above are wet-on-wet procedures, for the metallic surfaces in areas 2 and sputtered layer 4 (or layer 6) should not come into contact with free oxygen between the individual production steps. This would reoxidize and thus passivate them, making them unsuitable for accepting additional metal layers.

The material of metal layer 6 deposited without the lS application of external current should have the closest possible chemical resemblance to the electrolytically deposited metal of layers 2 and 7 to ensure the desired chemical homogeneity and better adhesion between layers 2, 6, and 7. If a thick sputtered layer 4 is used, however, the metallic reinforcement applied without the application of external current (described above) is not necessary.

The photoresist in areas 5 for patterning upper electroplated layer 7 is preferably applied before activating the lower metal layer in areas 2 and sputtered layer 4. The advantage of this is that the activation step has to be carried out only once. The disadvantage is that the resist patterns of the photoresist may not be sufficiently etched through in areas 5.

On the basis of an embodiment illustrated in FIGS. 4*a*–4*e* production method using a metallic start plating is described for electroplating processes which allow individual areas of an upper metallic electroplated layer to be stripped from the lower metallic electroplated layer, while maintaining firm adhesion to the lower electroplated layer in all other areas.

As in the embodiment shown in FIG. 3*a*, substrate 1 again has metallic, electrically, conductive areas 2 as well as electrically non-conductive areas 3. Metallic areas 2 can be formed, for example, by the lower electroplated layer and the non-conductive areas by a resist that is patterned by UV gravure lithography in the known manner.

In a first production step, the entire surface of substrate 1 is sputtered, as described above, but in this case using titanium. This sputtered layer 10 is 200 nm to 400 nm thick. The production step must be carried out so that titanium sputtered layer 10 contains as little oxygen as possible, thus also forming as little stable oxide as possible, for this is the only way to pattern it in the next process step by etching shown in FIG. 4*b*. It is therefore necessary in order to produce a good vacuum around substrate 1 prior to sputtering and to clean substrate 1 by etching (also using the sputtering technique). This should give lower electroplated layer 2 a smooth surface with little oxygen accumulating on the surface.

Figure 4A:
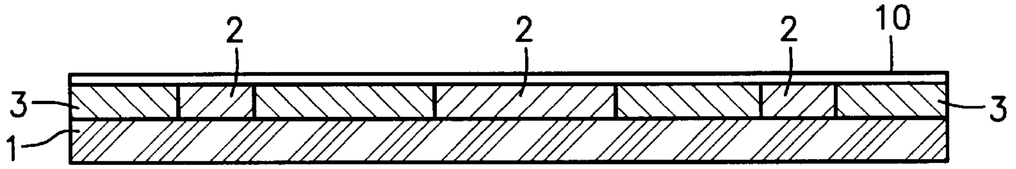
FIG. 4*a* shows cross-sections of multiple layers on the substrate during a first step according to a second embodiment of the present invention.
Figure 4B:
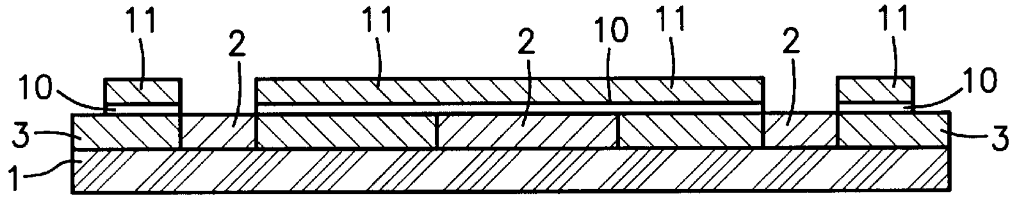
FIG. 4*b* shows cross-sections of the multiple layers on the substrate during a second step according to the second embodiment.
Figure 4C:
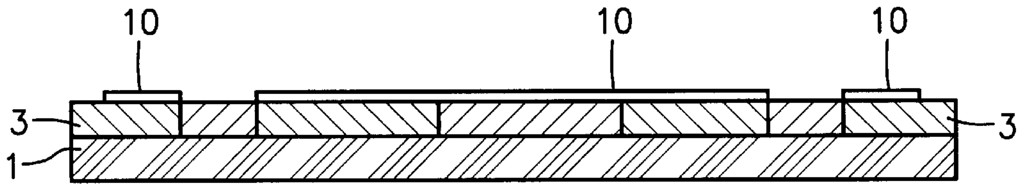
FIG. 4*c* shows cross-sections of the multiple layers on the substrate during a third step according to the second embodiment.

As shown in FIG. 4*b*, titanium sputtered layer 10 is masked with a photopatternable resist and etched in a solution containing hydrogen fluoride (hydrofluoric acid). A resist 11 that can be processed in media which do not attack the plastic or resist 3 on substrate 1 is used for masking. After this etching mask is removed (resist areas 11), the arrangement shown in FIG. 3*c* appears, and the remaining multilayer electroplating steps can be carried out.

Figure 4D:
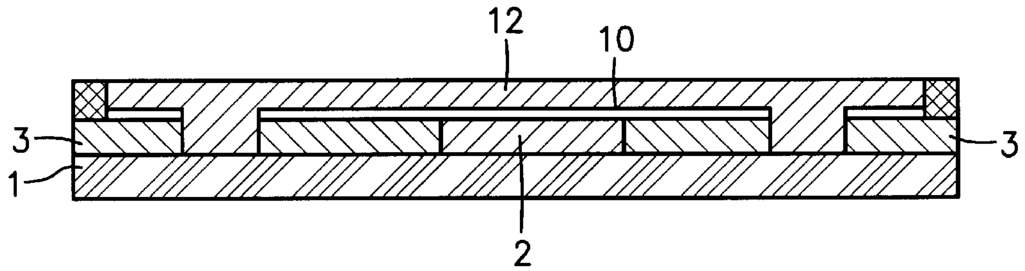
FIG. 4*d* shows cross-sections of the multiple layers on the substrate during a fourth step according to the second embodiment.
Figure 4E:
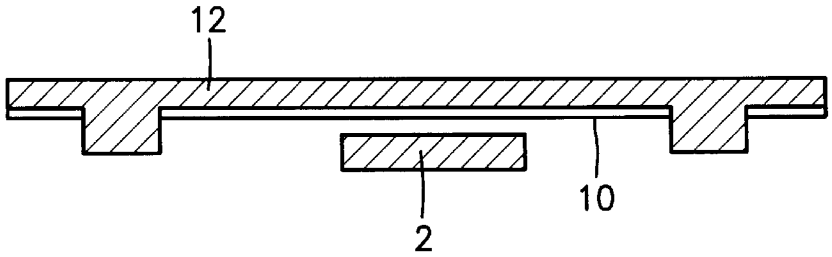
FIG. 4*e* shows cross-sections of the multiple layers on the substrate during a fifth step according to the second embodiment.

The subsequent deposition step with the application of external current and production of upper electroplated layer 12 shown in FIG. 4*d* are carried out after electrolytic activation of lower electroplated layer 2. Sputtered layer 10 made of titanium is passivated and is not affected by these processes. The electrolyte and counterelectrode are thus not contaminated by titanium.

In further process steps, multiple electroplated layers can be formed between patterned resist areas. The resist is removed at the end of this process chain. Wherever two metallic electroplated layers 2, 12 are separated by a titanium sputtered layer 10, the two layers 2 and 12 can be separated from each other by applying a mechanical force or a differential pressure.

In areas 2 of substrate 1, which are not covered by titanium sputtered layer 10, the properties of UV gravure lithography and multilayer electroplating are retained, as is the adhesion between electroplated layers 2 and 12.

In order to detach the two electroplated layers 2 and 12 in the areas of sputtered layer 10, it is not necessary to remove a sacrificial layer via long, lateral etching or stripping between electroplated layers 2 and 12 to be separated. Nor is any gap produced between the two mechanically separated electroplated layers 2 and 12. The surface morphology of lower electroplated layer 2 is mapped onto upper electroplated layer 12, making it possible to produce micromechanical components with moving parts shown in FIG. 4*e* which can be positioned close together, forming a seal.

What is claimed is:

1. A method for producing a micromechanical component, comprising the steps of:

a) applying a carrier layer to a substrate, the carrier layer including conductive areas and at least one nonconductive area;

b) applying a sputtered intermediate layer to the carrier layer, the sputtered intermediate layer being porous;

c) etching through the sputtered intermediate layer in the conductive areas of the carrier layer;

d) after step (c), removing at least one first portion of the sputtered intermediate layer from the conductive areas, second portions of the sputtered intermediate layer remaining on the carrier layer;

e) applying resist materials to predetermined regions of the second portions and to the conductive areas of the carrier layer;

f) electroplating a metallic layer onto particular areas between the resist materials; and g) after step (f), removing the substrate and the resist materials.

2. The method according to claim 1, wherein the sputtered intermediate layer has a thickness between 5 nm and 100 nm.

3. The method according to claim 1, wherein the sputtered intermediate layer has a thickness between 5 nm and 10 nm, and further comprising the steps of:

h) chemically activating the sputtered intermediate layer in a redox reaction for enabling the sputtered intermediate layer to accept a metal material;

I) chemically activating the conductive areas of the carrier layer using an anodic erosion procedure; and j) after step l), applying the electroplated metal layer on the sputtered intermediate layer.

4. The method according to claim 1, wherein the sputtered intermediate layer is composed of palladium.

5. A method for producing a micromechanical component, comprising the steps of:

a) applying a carrier layer to a substrate, the carrier layer including conductive areas and nonconductive areas;

b) applying a sputtered intermediate layer to the carrier layer, the sputtered intermediate layer being composed of titanium;

c) masking first areas of the sputtered intermediate layer with a resist material;

d) etching away the sputtered intermediate layer in second non-masked areas of the sputtered intermediate layer;

e) after step (d), removing the resist material;

f) applying further resist materials to the masked areas of the sputtered intermediate layer;

g) electroplating an upper electroplated layer onto particular areas between the further resist materials;

h) after step (g), removing the substrate and the further resist materials; and

I) after step (g), detaching the upper electroplated layer from the conductive areas of the carrier layer, the upper electroplated layer being provided on the sputtered intermediate layer.

6. The method according to claim 5, wherein the resist material includes a photo resist which is processed using stripping agents, and further comprising the steps of:

j) etching the photo resist in a hydrofluoric acid solution; and k) processing the nonconductive areas of the carrier layer in an aqueous alkaline medium, the nonconductive areas being composed of a plastic material.

7. The method according to claim 6, wherein the photo resist is an AZ resist.

* * * * *

UNITED STATES PATENT AND TRADEMARK OFFICE

CERTIFICATE OF CORRECTION

PATENT NO. : 6,174,416 B1
DATED : January 16, 2001

INVENTOR(S) : Magenau, Horst et al.

It is certified that error appears in the above-identified patent and that said Letters Patent is hereby corrected as shown below:

Column 1,
Line 4, change "BACKGROUND INFORMATION" to -- FIELD OF THE INVENTION --
Delete line 5
Line 12, change "2. Background Information" to -- BACKGROUND INFORMATION --
Line 42, change "discribed" to-- (described --
Line 19, change "Conventional." to -- conventional methods. --

Column 3,
Line 50, change "Conventional" to -- conventional --
Line 61, change "3a-3F" to -- 3a-3F. --
Line 65, change "below" to -- below, --

Column 5,
Line 4, delete "IS"

Column 6,
Line 45, change "I" to -- i --
Line 47, change "1" to -- i --

Column 7,
Line 3, change "I" to -- i --

Signed and Sealed this

Twenty-first Day of January, 2003

JAMES E. ROGAN
*Director of the United States Patent and Trademark Office*

UNITED STATES PATENT AND TRADEMARK OFFICE

CERTIFICATE OF CORRECTION

PATENT NO. : 6,174,416 B1 
DATED : January 16, 2001
INVENTOR(S) : Magenau, Horst et al.

It is certified that error appears in the above-identified patent and that said Letters Patent is hereby corrected as shown below:

Column 1,
Line 4, change "BACKGROUND INFORMATION" to -- FIELD OF THE INVETION --.
Delete line 5.
Line 12, change "2. Background Information" to -- BACKGROUND INFORMATION --.
Line 42, change "discribed" to -- (described --.

Column 2,
Line 19, change "Conventional." to -- conventional methods. --.

Column 3,
Line 50, change "Conventional" to -- conventional --.
Line 61, change "3a-3F" to -- 3a-3F. --.
Line 65, change "below" to -- below, --.

Column 5,
Line 4, delete "IS".

Column 6,
Lines 45 and 47, change "I" to -- i --.

Column 7,
Line 3, change "I" to -- i --.

This certificate supersedes Certificate of Correction issued January 21, 2003.

Signed and Sealed this

Sixth Day of December, 2005

JON W. DUDAS
*Director of the United States Patent and Trademark Office*